United States Patent
Ko et al.

(10) Patent No.: US 10,381,510 B2
(45) Date of Patent: Aug. 13, 2019

(54) RED LIGHT EMITTING DEVICE AND LIGHTING SYSTEM

(71) Applicant: LG INNOTEK CO., LTD., Seoul (KR)

(72) Inventors: Eun Bin Ko, Seoul (KR); Yong Jun Kim, Seoul (KR); Ki Yong Hong, Seoul (KR); Byung Hak Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/081,314

(22) Filed: Mar. 25, 2016

(65) Prior Publication Data

US 2016/0284934 A1    Sep. 29, 2016

(30) Foreign Application Priority Data

Mar. 25, 2015 (KR) .................. 10-2015-0041302
Mar. 25, 2015 (KR) .................. 10-2015-0041303
Mar. 25, 2015 (KR) .................. 10-2015-0041304

(51) Int. Cl.
    *H01L 33/06*     (2010.01)
    *H01L 33/02*     (2010.01)
    (Continued)

(52) U.S. Cl.
CPC ............. *H01L 33/06* (2013.01); *H01L 33/025* (2013.01); *H01L 33/14* (2013.01); *H01L 33/30* (2013.01);
(Continued)

(58) Field of Classification Search
CPC ....... H01L 33/06; H01L 33/12; H01L 33/025; H01L 33/14; H01L 33/30
See application file for complete search history.

(56) References Cited

U.S. PATENT DOCUMENTS 6,222,205 B1 * 4/2001 Geng ............... H01L 33/14
                                        257/103
6,479,836 B1 * 11/2002 Suzuki ............. B82Y 20/00
                                        257/103
(Continued)

FOREIGN PATENT DOCUMENTS

CN      1925180      3/2007
CN      100568549      12/2009
(Continued)

OTHER PUBLICATIONS

Su et al. "AlGaInP light emitting diode with a modulation-doped superlattice" in Japan Journal of Applied Physics vol. 42, pp. L 751-L 753. Published by the Japan Society of Applied Physics in 2003.*

(Continued)

*Primary Examiner* — Tuan A Hoang
(74) *Attorney, Agent, or Firm* — KED & Associates, LLP

(57) ABSTRACT

A red light emitting device, a method of fabricating a light emitting device, a light emitting device package, and a lighting system are provided. The red light emitting device may include a first semiconductor layer having a first conductivity, an active layer provided on the first semiconductor layer and including a quantum well and a quantum barrier, a second semiconductor layer having a second conductivity and provided on the active layer, a third semiconductor layer having the second conductivity on the second semiconductor layer, a fourth semiconductor layer having the second conductivity on the third semiconductor layer, and a fifth semiconductor layer having the second conductivity on the fourth semiconductor layer. The third semiconductor layer and the fourth semiconductor layer may include an AlGaInP-based semiconductor layer, and an Al (Continued)

composition of the fourth semiconductor layer may be lower than an Al composition of the third semiconductor layer.

9 Claims, 18 Drawing Sheets

(51) Int. Cl.
*H01L 33/14* (2010.01)
*H01L 33/30* (2010.01)
H01L 33/00 (2010.01)
H01L 33/04 (2010.01)
H01L 33/10 (2010.01)
H01L 33/12 (2010.01)

(52) U.S. Cl.
CPC .......... *H01L 33/0062* (2013.01); *H01L 33/04* (2013.01); *H01L 33/10* (2013.01); *H01L 33/12* (2013.01)

(56) References Cited

U.S. PATENT DOCUMENTS

| 8,610,151 | B2* | 12/2013 | Sasaki | H01L 33/14 257/102 |
| 2002/0104996 | A1* | 8/2002 | Kuo | H01L 33/0062 257/79 |
| 2009/0010290 | A1 | 1/2009 | Mayer et al. | |
| 2013/0228743 | A1* | 9/2013 | Fu | H01L 33/06 257/13 |
| 2014/0264273 | A1* | 9/2014 | Howell | H01L 29/7784 257/20 |
| 2016/0284934 | A1 | 9/2016 | Ko et al. | |
| 2017/0309780 | A1* | 10/2017 | Park | H01L 33/025 |

FOREIGN PATENT DOCUMENTS

| CN | 102468387 | 5/2012 | | |
| CN | 106025021 | 10/2016 | | |
| EP | 0 518 320 | 12/1992 | | |
| EP | 0518320 A2 * | 12/1992 | ............ | B82Y 20/00 |
| EP | 0518320 A2 * | 12/1992 | ............ | B82Y 20/00 |
| WO | WO 9750133 A1 * | 12/1997 | ............ | B82Y 20/00 |

OTHER PUBLICATIONS

Sze "Semiconductor Devices—Physics and Technology", pp. 41 and 44. Published by John Wiley & Sons, Inc. in 2002. (Year: 2002).*

Su et al. "AlGaInP light emitting diode with a modulation-doped superlattice" in Japan Journal of Applied Physics vol. 42, pp. L751-L753. Published by the Japan Society of Applied Physics in 2003. (Year: 2003).*

European Search Report dated Jul. 13, 2016 issued in Application No. 16162140.4.

Chinese Office Action dated Feb. 28, 2019 issued in Application No. 201610177799.0.

* cited by examiner

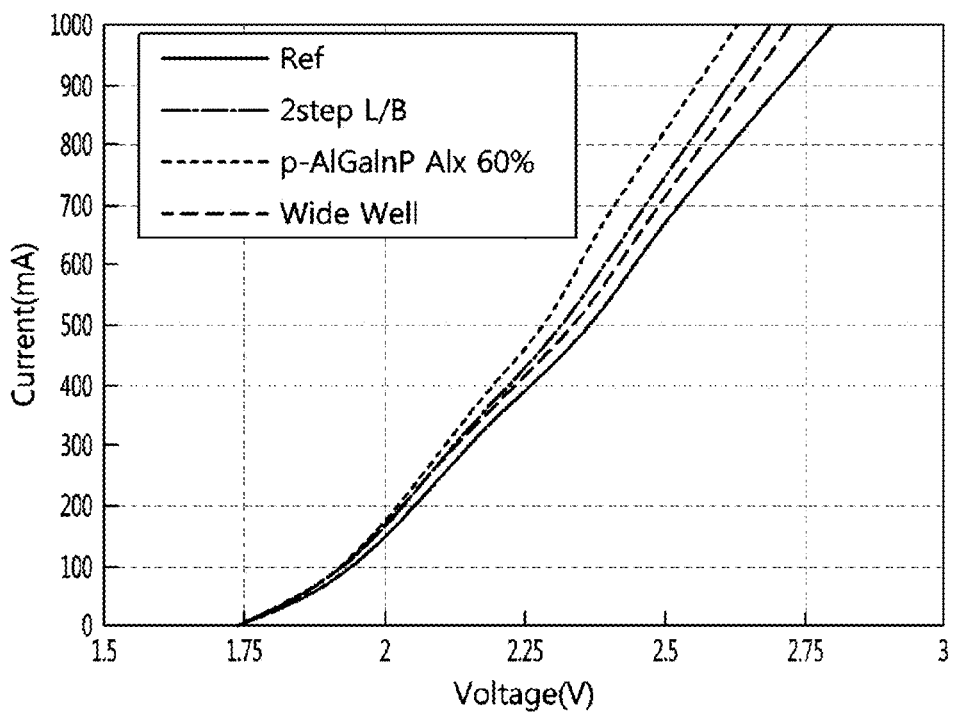

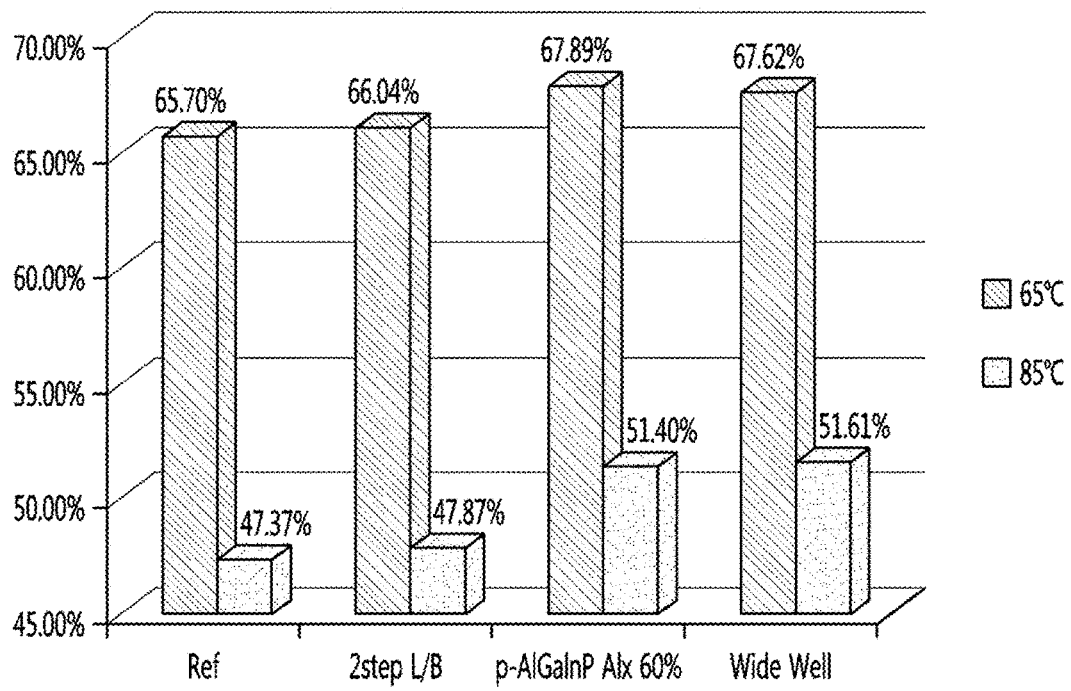

ued States 10,381,510 B2

RED LIGHT EMITTING DEVICE AND LIGHTING SYSTEM

CROSS-REFERENCE TO RELATED APPLICATION

This application claims priority under 35 U.S.C. § 119 to Korean Patent Application Nos. 10-2015-0041302, filed on Mar. 25, 2015, 10-2015-0041303, filed on Mar. 25, 2015, and 10-2015-0041304, filed on Mar. 25, 2015, whose entire disclosures are incorporated herein by reference.

BACKGROUND

1. Field

Embodiments relate to a red light emitting device, a method of fabricating a light emitting device, a light emitting device package, and a lighting system.

2. Background

A light emitting diode (LED) includes a P-N junction diode that converts electrical energy into light energy. The LED may be produced by combining dopants of semiconductor compounds from the periodic table. LEDs representing various colors, such as; e.g., blue, green, UV, and red LEDs may be made by adjusting compositional ratios of the semiconductor compounds. For example, a red LED may include an AlGaInP-based LED to convert electrical energy into light having a wavelength in a range of about 570 nm to about 630 nm. Wavelength variation may be determined depending on an intensity of bandgap energy of the LED, in which the intensity of the bandgap energy may be adjusted by adjusting a compositional ratio of Al and Ga, and the wavelength may be shortened as the compositional ratio of Al is increased.

Application of the AlGaInP-based red LED has grown to include, for example, a light source for high color rendering index (high CRI) or a light source for a vehicle, and competition for AlGaInP-based red LEDs in the market is increasing. Accordingly, ensuring high optical power (Po) and/or electrical reliability may become important. For example, according to the related art, as current is injected, doping elements of carriers may diffuse into an active area to lower a light speed, and operating voltage Vf may increase. When a temperature or current is increased due to the heat emitted from an LED chip, external quantum efficiency (EQE) may drop.

BRIEF DESCRIPTION OF THE DRAWINGS

Embodiments will be described in detail with reference to the following drawings in which like reference numbers refer to like elements wherein:

FIG. 3 is a graph showing I-V curve data of red light emitting devices according to a comparative example and the embodiments;

FIG. 4 is a graph showing thermal droop data of red light emitting devices according to the comparative example and the embodiments;

DETAILED DESCRIPTION

First to Fifth Embodiments

Figure 1:
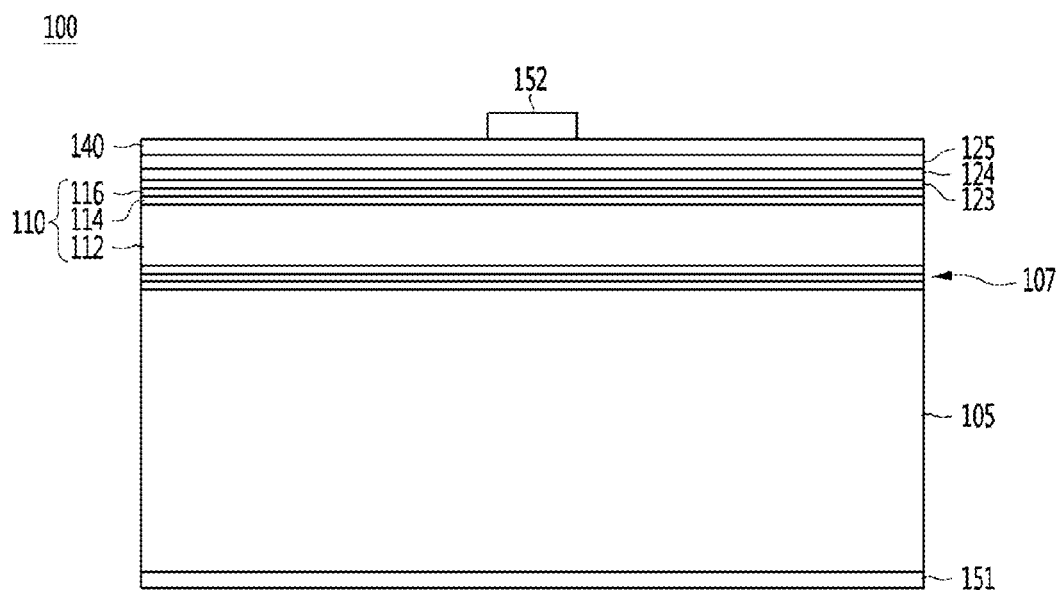
FIG. 1 is a sectional view of a red light emitting device according to an embodiment.
Figure 2A:
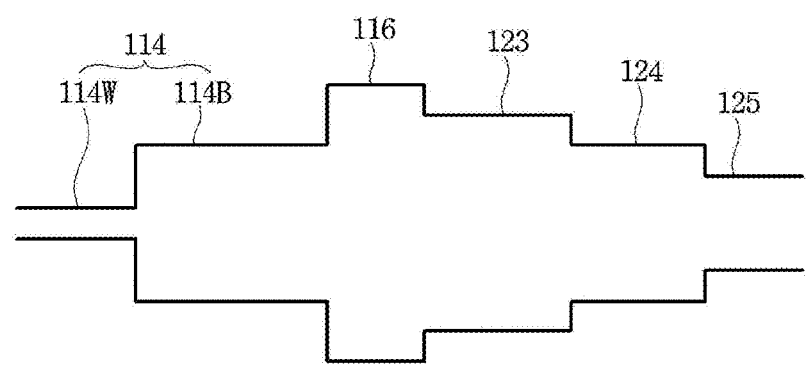
FIG. 2A is an energy band diagram of a red light emitting device according to a first embodiment.

FIG. 1 is a sectional view of a red light emitting device 100 according to an embodiment. The red light emitting device 100 may include a first conductive type first semiconductor layer 112, an active layer 114, a second conductive type second semiconductor layer 116, a second conductive type third semiconductor layer 123, a second conductive type fourth semiconductor layer 124, and a second conductive type fifth semiconductor layer 125. For example, as shown in FIGS. 1 and 2A, the red light emitting device 100 may include the first conductive type first semiconductor layer 112, the active layer 114 including a quantum well 114W and a quantum barrier 114B and provided on the first conductive type first semiconductor layer 112, the second conductive type second semiconductor layer 116 on the active layer 114, the second conductive type third semiconductor layer 123 on the second conductive type second semiconductor layer 116, the second conductive type fourth semiconductor layer 124 on the second conductive type third semiconductor layer 123, and the second conductive type fifth semiconductor layer 125 on the second conductive type fourth semiconductor layer 124. FIG. 1 shows a lateral-type light emitting device, but the embodiment is not limited thereto.

An AlGaInP-based red light emitting device may be weaker than a GaN-based blue LED in terms of thermal droop. Since AlGaInP-based materials have energy band offset smaller than that of GaN-based materials, the AlGaInP-based materials may be weaker in thermal droop as current is increased or temperature is increased. In the embodiment, acceptors may have a rapider ionization rate compared to an ionization rate of donors. In order to inhibit ionized donors, droop may be overcome by improving GaP layer quality through optimization of Al compositions or improvement in a structure of an active layer in a p-AlGaInP-based semiconductor layer.

Referring to FIG. 2A, in the red light emitting device according to a first embodiment, the second conductive type third semiconductor layer 123 and the second conductive type fourth semiconductor layer 124 may include AlGaInP-based semiconductor layers. The second conductive type fourth semiconductor layer 124 may have an Al composition lower than an Al composition of the second conductive type third semiconductor layer 123. For example, the second conductive type third semiconductor layer 123 may have a composition of $(Al_{x3}Ga_{1-x3})_y In_{1-y}P$ layer ($0.80 \leq x3 \leq 90$, $0.4 \leq y \leq 0.6$).

The second conductive type fourth semiconductor layer 124 may have a composition of $(Al_{x3}Ga_{1-x3})_y In_{1-y}P$ layer ($0.50 \leq x4 \leq 70$, $0.4 \leq y \leq 0.6$). In the p-AlGaInP-based layer, GaP layer quality may be improved by optimizing Al compositions.

The second conductive type fourth semiconductor layer 124 may have a bandgap energy lower than a bandgap energy of the second conductive type third semiconductor layer 123. The second conductive type fourth semiconductor layer 124 may have a bandgap energy higher than a bandgap energy of the second conductive type fifth semiconductor layer 125.

The second conductive type fourth semiconductor layer 124 may be provided between the second conductive type third semiconductor layer 123 and the second conductive type fifth semiconductor layer 125 to serve as an energy bandgap buffer layer. The second conductive type fourth semiconductor layer 124 may be provided between the second conductive type third semiconductor layer 123 and the second conductive type fifth semiconductor layer 125 to reduce strain between the second conductive type third semiconductor layer 123 and the second conductive type fifth semiconductor layer 125 to improve light emitting device quality.

Figure 2B:
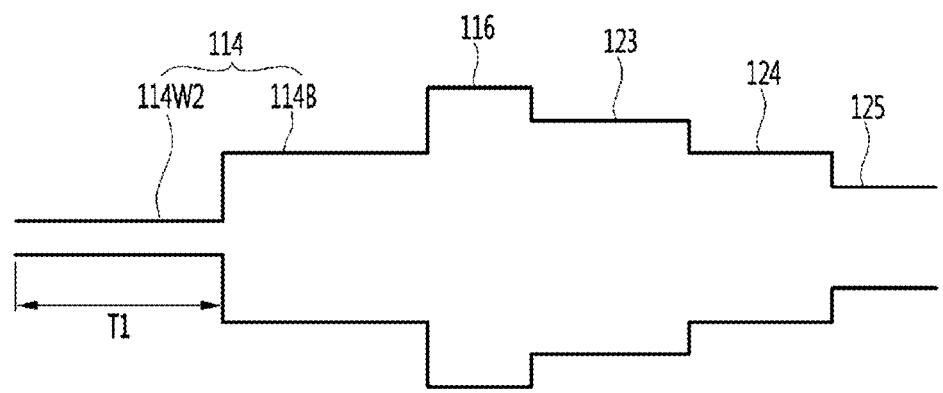
FIG. 2B is an energy band diagram of a red light emitting device according to a second embodiment.

Referring to FIG. 2B, a red light emitting device according to a second embodiment may include the features of the first embodiment, and the following description may focus on main features of the second embodiment that differ from the first embodiment. A quantum well 114W2 according to the second embodiment may have the composition of a $(Al_pGa_{1-p})_q In_{1-q}P$ layer ($0.05 \leq p \leq 0.20$, $0.4 \leq q \leq 0.6$). The quantum well 114W2 may have a thickness T1 in a range of about 150 Å to 170 Å. The quantum well 114W2 may be paired with the quantum barrier 114B, and about 12 pairs may be formed, but the embodiment is not limited thereto. The thickness T1 of the quantum well 114W2 in the active layer may be thicker so that radiative recombination may be increased in an active layer region, and light efficiency may be improved.

Figure 2C:
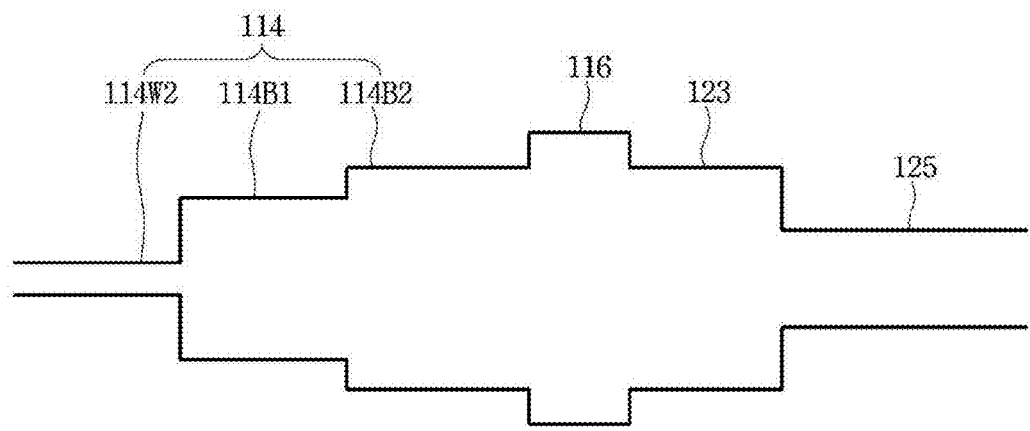
FIG. 2C is an energy band diagram of a red light emitting device according to a third embodiment.

Referring to FIG. 2C, a red light emitting device according to a third embodiment may include features of the first embodiment or the second embodiment, and the following description of the third embodiment may focus on main features of the third embodiment that differ from previous embodiments. A quantum barrier according to the third embodiment may include a last quantum barrier closest to the second conductive type second semiconductor layer 116, and the last quantum barrier may include a first last quantum barrier 114B1 having an Al composition of a first concentration and a second last quantum barrier 114B2 having an Al composition of a second concentration higher than the first concentration.

The Al composition in the last quantum barrier may be graded or stepped from the quantum well 114W2 toward the second conductive type second semiconductor layer 116. For example, the second last quantum barrier 114B2 may be provided closer to the second conductive type second semiconductor layer 116 than the first last quantum barrier 114B1. The last quantum barrier may include the first last quantum barrier 114B1, which may be an $(Al_{p1}Ga_{1-p1})_{q1} In_{1-q1}P$ layer ($0.60 \leq p1 \leq 0.80$, $0.4 \leq q1 \leq 10.6$), and the second last quantum barrier 114B2, which may be an $(Al_{p2}Ga_{1-p2})_{q2} In_{1-q2}P$ layer ($0.80 \leq p2 \leq 0.90$, $0.4 \leq q2 \leq 0.6$).

The first last quantum barrier 114B1 and the second last quantum barrier 114B2 may have an equal thickness, but the embodiment is not limited thereto. The last quantum barrier may be formed in an Al composition step structure including the first last quantum barrier 114B1 having Al composition of the first concentration and the second last quantum barrier 114B2 having Al composition of the second concentration higher than the first concentration, thereby effectively blocking electrons and improving layer quality.

Figure 2D:
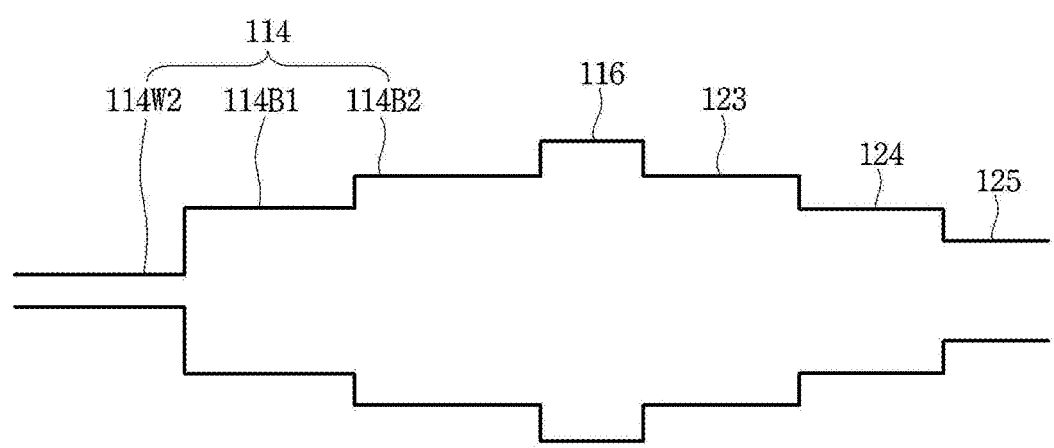
FIG. 2D is an energy band diagram of a red light emitting device according to a fourth embodiment.

Referring to FIG. 2D, a red light emitting device according to a fourth embodiment may be obtained by combining the first to third embodiments, described above, with each other. Thus, the fourth embodiment may include the main features of the previous embodiments.

FIG. 3 is a graph showing I-V curve data of red light emitting devices according to a comparative example and the first to third embodiments.

TABLE 1

| Comparison with Ref | P—AlGaInP 60% (First embodiment) | Wide Well (Second embodiment) | 2 step L/B (Third embodiment) |
|---|---|---|---|
| Voltage improvement % | 2.56% | 1.08% | 1.62% |

Table 1 shows a voltage improvement percentage (Voltage improvement %) of the first to third embodiments as compared to the comparative example. As shown in Table 1 and FIG. 3, the voltage improvement percentages of the first to third embodiments are higher as compared to the comparative example (Ref) in the I-V curve of FIG. 3.

FIG. 4 is a graph showing thermal droop data of red light emitting devices according to the comparative example and the first to third embodiments. As shown in FIG. 4, in relation to 1 W chip package (PKG) thermal droop, the P—AlGaInP 60% (the first embodiment), the Wide Well (the second embodiment), and the 2 step L/B (the third embodiment) are improved by about 1% to 2.5% compared to the Ref (the comparative example).

TABLE 2

| Ref | P—AlGaInP 60% (First embodiment) | Wide Well (Second embodiment) | 2step L/B (Third embodiment) |
|---|---|---|---|
| 85.64% | 93.27% | 89.25% | 89.37% |

Table 2 shows EQE variation when current is varied from about 350 mA to 1000 mA in the 1 W chip PKG, that is, EQE data of the comparative example (Ref) and the first to third embodiments. As shown in Table 2, the EQE of the first to third embodiments is improved by about 4% to about 8% based on the EQE of the comparative example.

Figure 5:
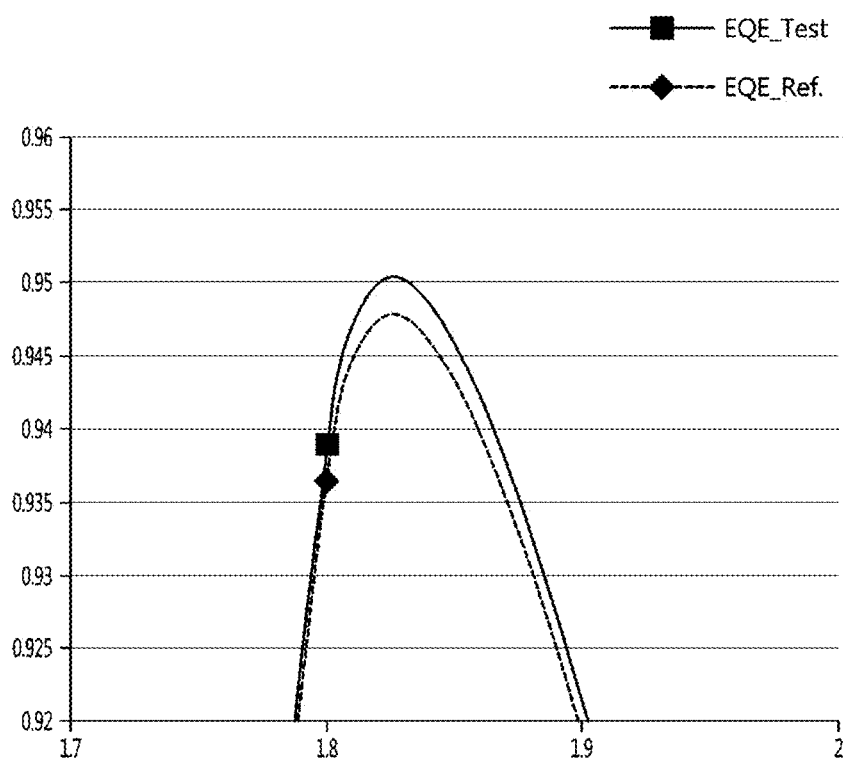
FIG. 5 is a graph showing EQE data of red light emitting devices according to the comparative example and the fourth embodiment.

FIG. 5 is a graph showing EQE data of red light emitting devices according to the comparative example and the fourth embodiment. As previously discussed, the fourth embodiment may be obtained by combining the first to third embodiments with each other. FIG. 5 shows EQE of the fourth embodiment may be higher compared with EQE of the comparative example.

Figure 6:
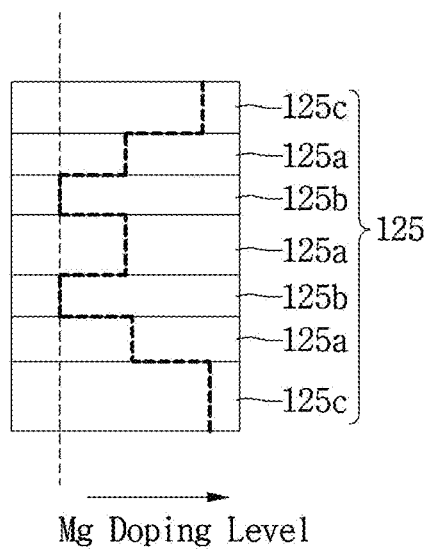
FIG. 6 is an enlarged view of a second conductive type fifth semiconductor layer of a red light emitting device according to a fifth embodiment.

FIG. 6 is an enlarged view of a second conductive type fifth semiconductor layer 125 of the red light emitting device according to a fifth embodiment. The second conductive type fifth semiconductor layer 125 may include a superlattice structure of a GaP layer 125a/In$_x$Ga$_{1-x}$P layer (0≤x≤1) 125b. The second conductive type fifth semiconductor layer 125 may include a third GaP layer 125c doped with second conductive type dopants. The second conductive type dopants may be P type conductive type dopants, but the embodiment is not limited thereto.

The second conductive type fifth semiconductor layer 125 may be doped with the second conductive type dopants having a first concentration, and the GaP layer 125a may be doped with the second conductive type dopants having a concentration lower than the first concentration. The InxGa1-xP layer (0≤x≤1) 125b may not be doped with the second conductive type dopants. For example, the second conductive type fifth semiconductor layer 125 may be doped with magnesium (Mg) atoms at a concentration of about 10×10$^{18}$ atoms/cm$^3$, the GaP layer 125a may be doped with Mg atoms at a concentration of about 10×10$^{17}$ atoms/cm$^3$, and the In$_x$Ga$_{1-x}$P layer (0≤x≤1) 125b may not be doped with the second conductive type dopants, but the embodiment is not limited thereto. Accordingly, the second conductive type fifth semiconductor layer 125 may have the superlattice structure of the GaP layer 125a/InxGa1-xP layer (0≤x≤1) 125b. The InxGa1-xP layer (0≤x≤1) 125b may represent a lower energy level, and the GaP layer 125a may represent an energy level higher than that of the InxGa1-xP layer (0≤x≤1) 125b.

Sixth Embodiment

According to a sixth embodiment, second conductive type third semiconductor layer 123 may be provided between active layer 114 and second conductive type second semiconductor layer 116. The second conductive type third semiconductor layer 123 may include an (Al$_x$Ga$_{1-x}$)InP layer (0≤x≤1). An Al composition may be graded or stepped in the second conductive type third semiconductor layer 123. For example, the Al composition in second conductive type third semiconductor layer 123 may be increased from the active layer 114 to the second conductive type fifth semiconductor layer 125.

Figure 7A:
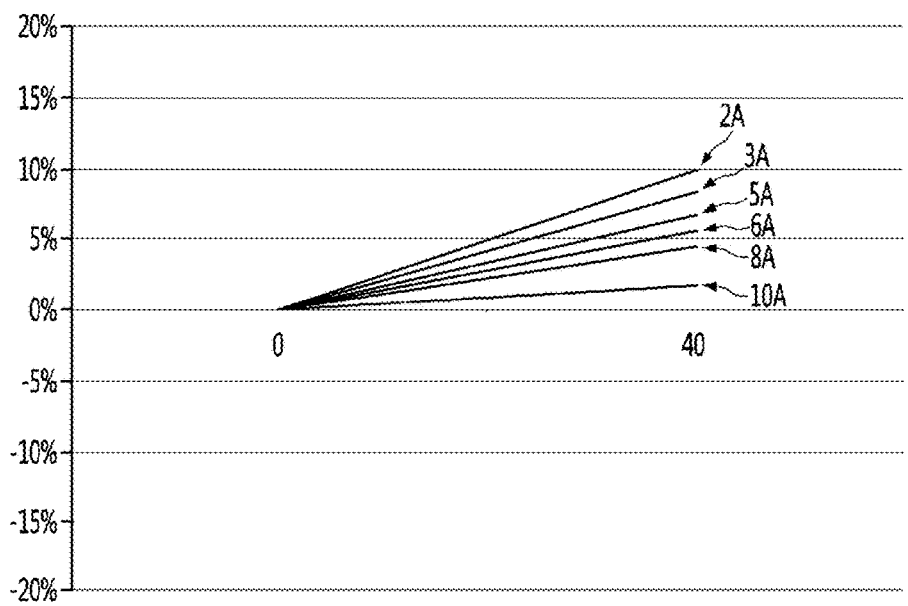
FIGS. 7A and 7B are graphs showing operating voltage data of red light emitting devices according to the comparative example and a sixth embodiment.
Figure 7B:
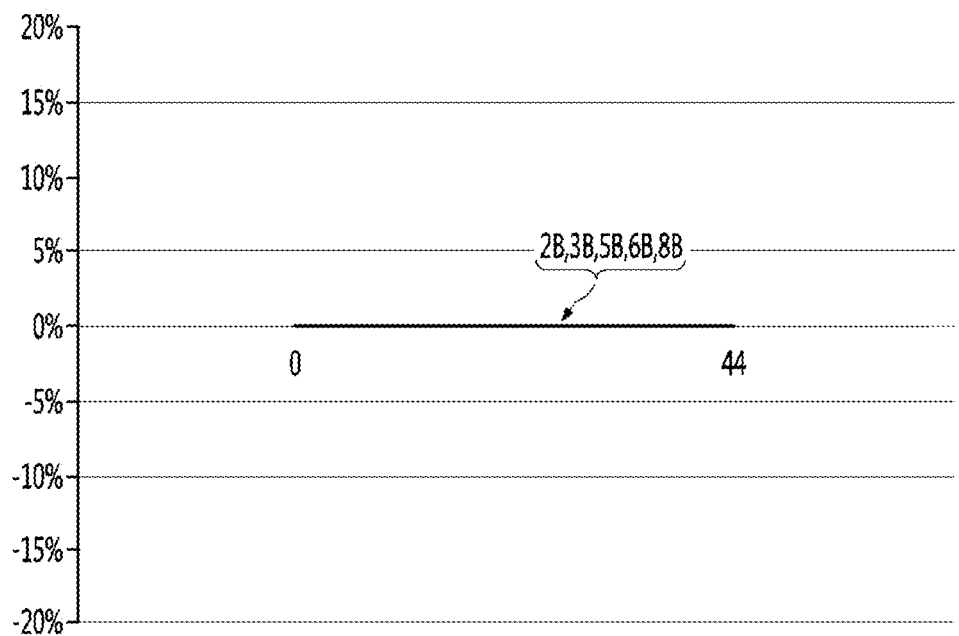

FIGS. 7A and 7B are graphs showing operating voltage data of red light emitting devices according to a comparative example and the sixth embodiment. According to the sixth embodiment, the second conductive type third semiconductor layer 123 having the Al composition, which may be gradually graded, may be provided between the active layer 114 and the second conductive type second semiconductor layer 116 to form a bandgap (Eg) buffer layer.

As shown in FIG. 7A, in the comparative example, when the bandgap (Eg) buffer layer is not provided, that is, when the second conductive type third semiconductor layer 123 is not provided, an operating voltage (Vf) may increase as current is injected in a reliability life test. For example, the comparative example has test results 2A, 3A, 5A, 6A, 8A, or 10A as shown in FIG. 7A.

As shown in FIG. 7B, when the second conductive type third semiconductor layer 123, which may serve as the Eg buffer layer, is provided between the active layer 114 and the second conductive type second semiconductor layer 116, variation of the operating voltage Vf may be stably maintained. For example, the embodiment has test results 2B, 3B, 5B, 6B, 8B as shown in FIG. 7B.

Figure 8:
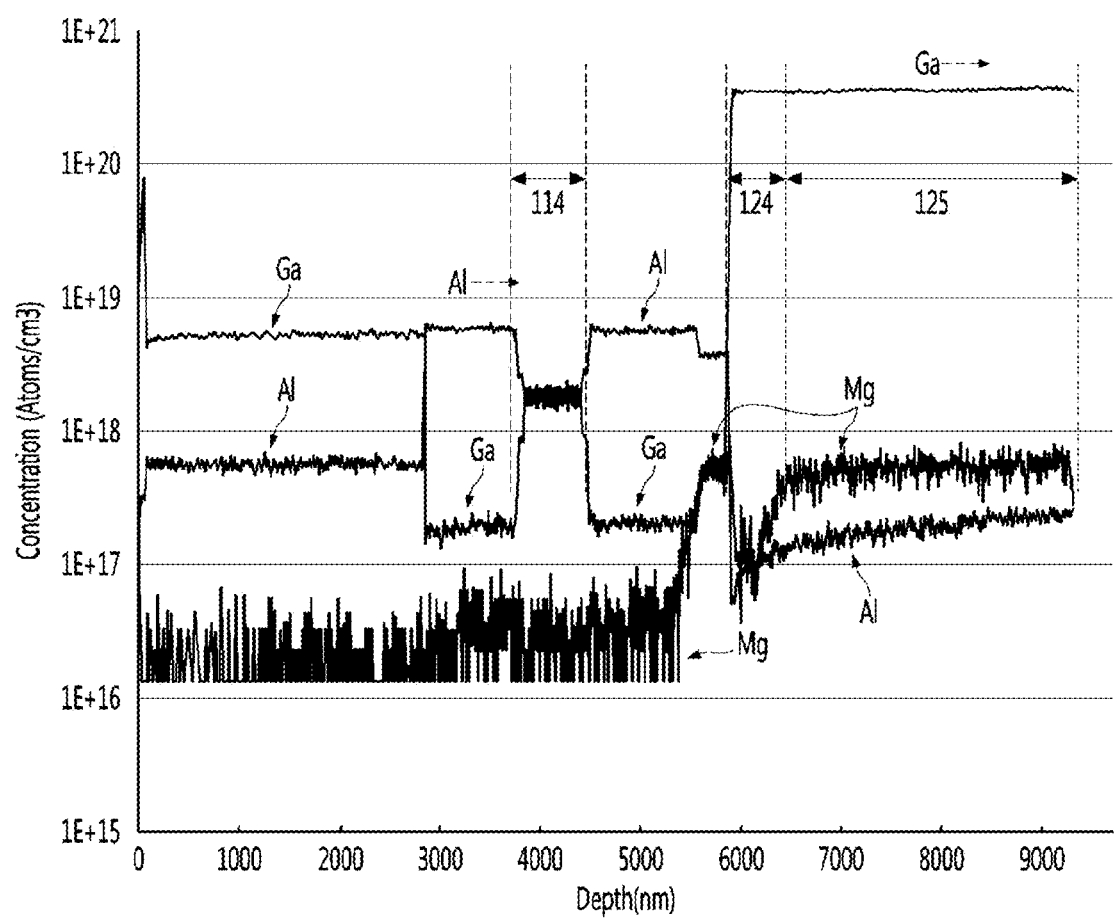
FIG. 8 is a graph showing secondary ion mass spectrometry (SIMS) data of a red light emitting device according to an embodiment.

FIG. 8 is a graph showing SIMS data according to a red light emitting device according to the sixth embodiment, in which a concentration of the second conductive type atoms doped into the second conductive type fourth semiconductor layer 124 may be lower than that of the second conductive type fifth semiconductor layer 125. For example, a concentration of Mg atoms, which may be the second conductive type atoms, doped into the second conductive type fourth semiconductor layer 124 may be lower than a concentration of Mg atoms, doped into the second conductive type fifth semiconductor layer 125.

The second conductive type fourth semiconductor layer 124 may be a GaP layer, Mg atoms may be doped as P-type dopants, and a doping concentration may be in a range of about 1×10$^{16}$ to 5×10$^{17}$ atoms/cm$^3$. The second conductive type fifth semiconductor layer 125 may be a GaP layer, Mg atoms may be doped as P-type dopants, and a doping concentration may be in a range of about 5×10$^{16}$ to 1×10$^{18}$ atoms/cm$^3$.

In addition, the concentration of the second conductive type atoms doped into the second conductive type fourth semiconductor layer 124 may be lower than that of the second conductive type second semiconductor layer 116. For example, the concentration of Mg atoms, which may be the second conductive type atoms, doped into the second conductive type fourth semiconductor layer 124 may be lower than the concentration of Mg atoms doped into the second conductive type second semiconductor layer 116. The second conductive type second semiconductor layer 116 may be an AlGaInP layer, Mg atoms may be doped as P-type dopants, and the doping concentration may be in a range of 5×10$^{16}$ to 1×10$^{18}$ atoms/cm$^3$. Dopants, for example, Mg atoms of the second conductive type fifth semiconductor layer 125, may diffuse into the active layer as current is injected in an LED life test, thereby causing a drop in light speed.

According to the sixth embodiment, in order to prevent the drop in light speed resulting from the diffusion of the dopants of the second conductive type fifth semiconductor layer 125, the second conductive type fourth semiconductor layer 124 having the concentration lower than that of Mg atoms, doped into the second conductive type fifth semiconductor layer 125 may be provided between the second conductive type fifth semiconductor layer 125 and the second conductive type second semiconductor layer 116, thereby trapping diffused dopants, for example, Mg atoms, to prevent the dopants from being diffused so that the light speed may be maintained.

Figure 9A:
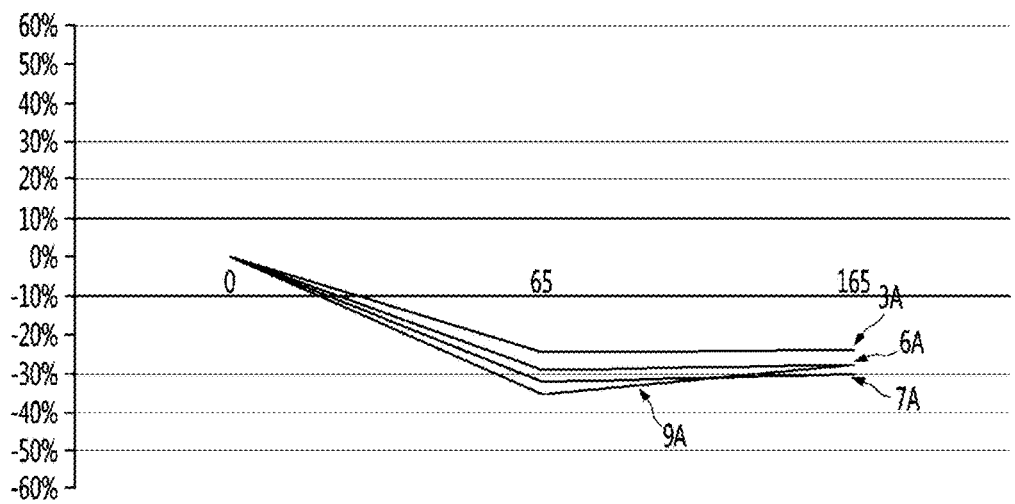
FIGS. 9A and 9B are graphs showing light speed variation data in an operation/life test according to the comparative example and the embodiment.
Figure 9B:
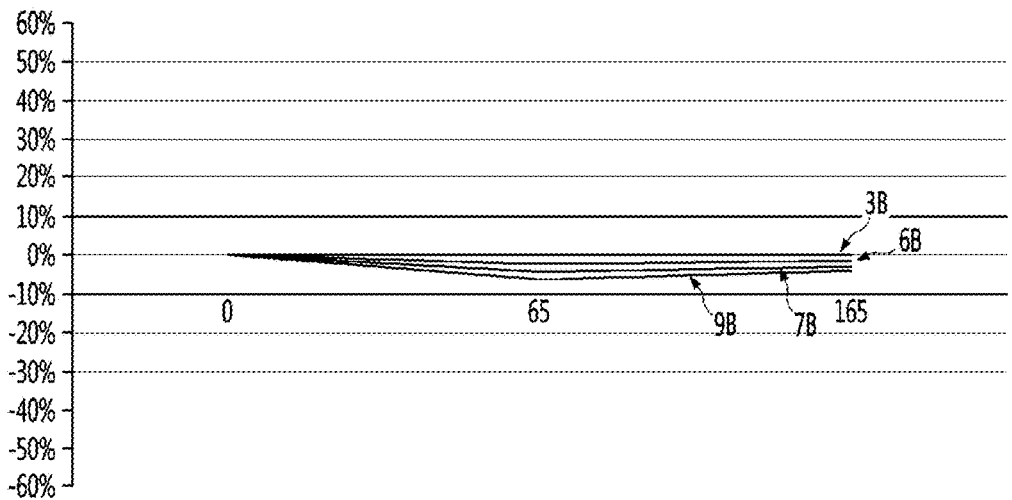

FIGS. 9A and 9B are graphs showing light speed variation data in an operation/life test according to the comparative example and the sixth embodiment. Numbers 3A, 6A, 7A, 9A in FIG. 9A refer to sample numbers of the comparative example. Numbers 3B, 6B, 7B, 9B in FIG. 9B refer to sample numbers of the sixth embodiment. FIG. 9A, according to the comparative example, shows that light speed may be out of a predetermined allowable error range of ±10% as current is injected (along an X axis) in an LED life test. In contrast, FIG. 9B, according to the sixth embodiment, shows that light speed may be maintained within a predetermined allowable error range of ±10% as the current is injected (along an X axis) in the LED life test.

Figure 10:
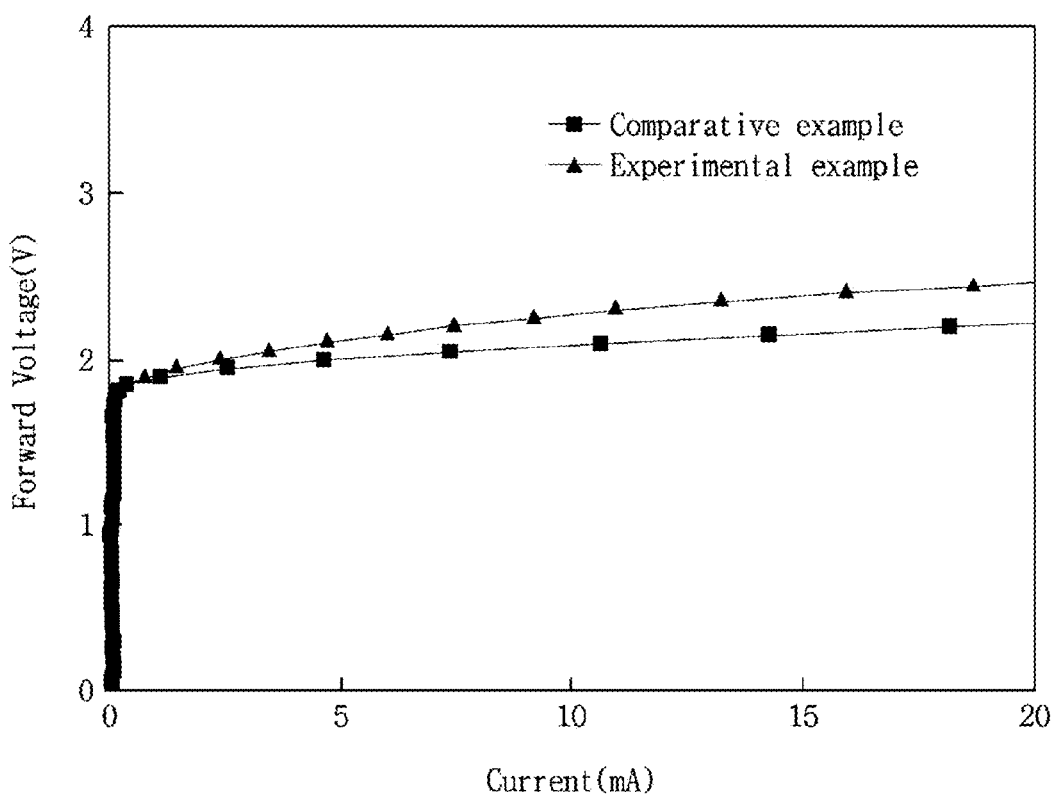
FIG. 10 is a graph showing operating voltage data of red light emitting devices according to the comparative example and the embodiment.
Figure 11:
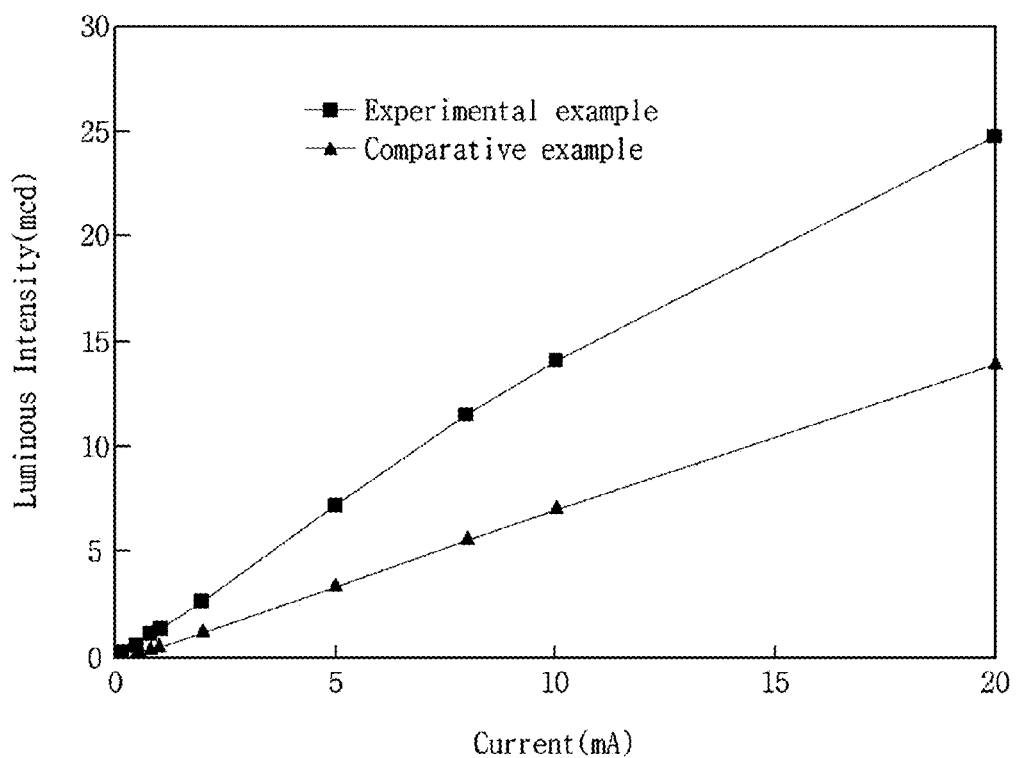
FIG. 11 is a graph showing light speed data of red light emitting devices according to the comparative example and the embodiment.

The second conductive type fourth semiconductor layer 124 may be thinner than the second conductive type fifth semiconductor layer 125. For example, the second conductive type fourth semiconductor layer 124 may have a thickness in the range of about 1500 Å to about 5000 Å, and the second conductive type fifth semiconductor layer 125 may have a thickness in the range of 20,000 Å to 50,000 Å. The second conductive type fifth semiconductor layer 125 may be thicker than the second conductive type second semiconductor layer 116. For example, the second conductive type fifth semiconductor layer 125 may have a thickness at least about 10 times thicker than that of the second conductive type second semiconductor layer 116. Accordingly, reliability of the red light emitting device according to the sixth embodiment may be improved, and the light speed may be improved. For example, the second conductive type fifth semiconductor layer 125 may have the thickness in the range of 8,000 Å to 140,000 Å, and the second conductive type second semiconductor layer 116 may have the thickness in the range of 2,000 Å to 6,000 Å. As shown in FIGS. 10 and 11, according to the sixth embodiment, as the thickness of the second conductive type fifth semiconductor layer 125 performing current spreading and a window function is increased to at least 10 times thicker than the thickness of the second conductive type second semiconductor layer 116, the operating voltage Vf and the light speed may be improved.

In order to distribute the light emitted from the light emitting device upward, a distributed Bragg-Reflector serving as a semiconductor reflective layer 107 may be provided between a substrate 105 and the active layer 114. The semiconductor reflective layer 107 may include a superlattice layer formed by stacking at least one pair of a first refractive layer, having a first refractive index and a second refractive layer having a second refractive index greater than the first refractive index while alternating the first refractive layer and the second refractive layer.

The semiconductor reflective layer 107 may include an AlAs layer/AlGaAs layer and may be doped with the first conductive type dopants, but embodiments are not limited thereto. An Al composition of the AlAs layer may be higher than an Al composition of the AlGaAs layer, and the semiconductor reflective layer 115 may effectively reflect light having a wavelength within a red color range.

Figure 12:
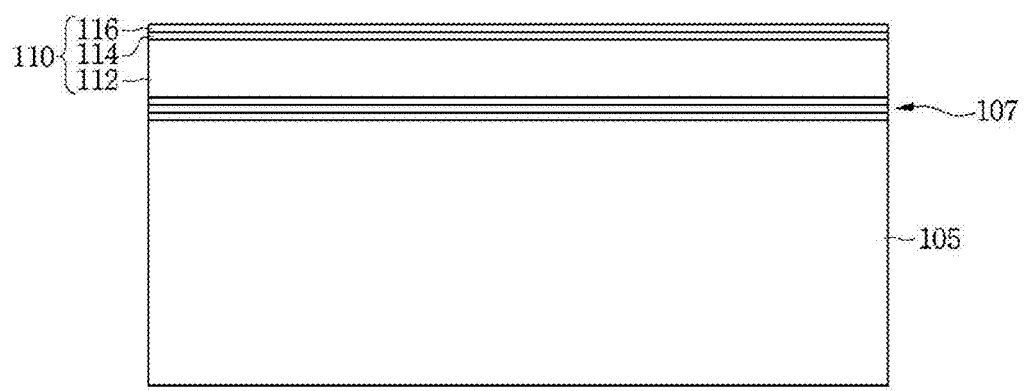
FIGS. 12 to 14 are sectional views sequentially showing a method of fabricating a red light emitting device according to an embodiment.
Figure 13:
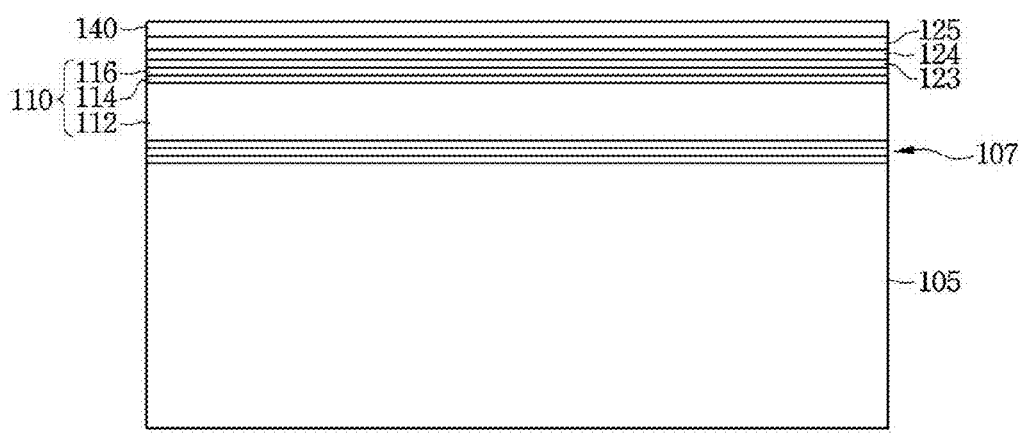
Figure 14:
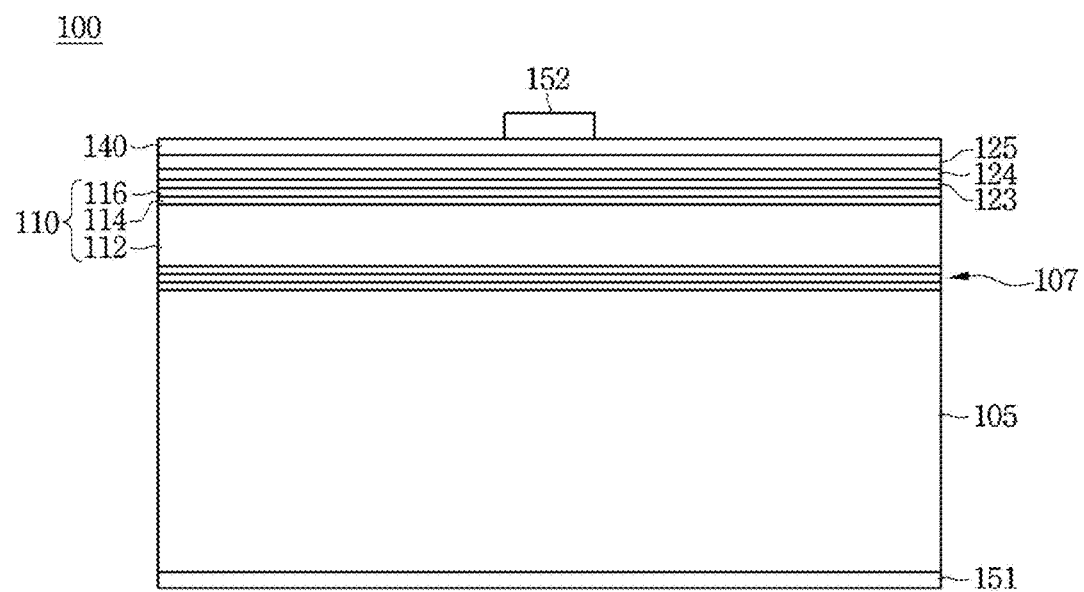

A method of fabricating a red light emitting device according to embodiments are shown in FIGS. 12 to 14. As shown in FIG. 12, the substrate 105 is prepared. The substrate 105 may be formed of a material representing excellent thermal conductivity and may include a conductive type substrate or an insulating substrate. For example, the substrate 105 may include at least one of GaAs, sapphire (Al$_2$O$_3$), SiC, Si, GaN, ZnO, GaP, InP, Ge or Ga$_2$O$_3$. A concavo-convex structure may be formed in the substrate 105, but embodiments are not limited thereto. Impurities on a surface of the substrate 105 may be removed through wet cleaning. A buffer layer may be formed on the substrate 105. The buffer layer may reduce lattice mismatch between a material of the light emitting structure 110 and the substrate 105. The buffer layer may include at least one of Group III-V compound semiconductors such as GaN, InN, AlN, InGaN, AlGaN, InAlGaN, or AlInN.

Thereafter, the semiconductor reflective layer 107 may be formed on the substrate 105 or the buffer layer. The semiconductor reflective layer 107 may include a superlattice layer formed by stacking at least one pair of a first refractive layer, having a first refractive index, and a second refractive layer, having a second refractive index greater than the first refractive index while alternating the first refractive layer and the second refractive layer. The semiconductor reflective layer 107 may be formed together with a light emitting structure 110 to be formed later in situ through metal-prganic chemical vapor deposition (MOCVD), but the embodiments are not limited thereto.

A reflection effect of the semiconductor reflective layer 107 may be produced due to constructive interference between light waves, the second refractive layer having a higher refractive index located at an outermost layer to which light is incident, and the thickness of the second refractive layer being thinner than that of the first refractive layer having a lower refractive index, so that the constructive interference, the reflection effect, and the light emission efficiency may be increased. The semiconductor reflective layer 107 may include an AlAs layer/AlGaAs layer, and the semiconductor reflective layer 107 may be doped with the first conductive type dopants, but embodiments are not limited thereto.

Thereafter, the light emitting structure 110 including the first conductive type first semiconductor layer 112, the active layer 114, and the second conductive type second semiconductor layer 116 may be formed on the semiconductor reflective layer 107. The first conductive type first semiconductor layer 112 may be formed with a semiconductor compound, for example, a Group III-V or Group II-VI compound semiconductor, and may be doped with the first conductive type dopants. When the first conductive type first semiconductor layer 112 is an N type semiconductor layer, the N-type dopants may include Si, Ge, Sn, Se, or Te, but the embodiment is not limited thereto.

The first conductive type first semiconductor layer 112 may include a semiconductor material having a compositional formula of In$_x$Al$_y$Ga$_{1-x-y}$P (0≤x≤1, 0≤y≤1, 0≤x+y≤1) or In$_x$Al$_y$Ga$_{1-x-y}$N (0≤x≤1, 0≤y≤1, 0≤x+y≤1). The first conductive type first semiconductor layer 112 may include at least one of AlGaP, InGaP, AlInGaP, InP, GaN, InN, AlN, InGaN, AlGaN, InAlGaN, AlInN, AlGaAs, InGaAs, AlInGaAs, or GaP. The first conductive type first semiconductor layer 112 may be formed through a chemical vapor deposition (CVD), molecular beam epitaxy (MBE), sputtering, or hydride vapor phase epitaxy (HVPE) scheme, but the embodiment is not limited thereto.

Thereafter, the active layer 114 may be formed on the first conductive type first semiconductor layer 112. The active layer 114 may emit light having energy determined by an intrinsic energy band of a material of the active layer (light emitting layer) as electrons injected into the active layer through the first conductive type first semiconductor layer 112 meet holes injected into the active layer the second conductive type second semiconductor layer 116 formed thereafter.

The active layer 114 may be formed in at least one of a single quantum well structure, a multi-quantum well structure (MQW), a quantum-wire structure, or a quantum dot structure. The active layer 114 may include a quantum well 114W/quantum barrier 114B structure. For example, the active layer 114 may be formed in at least one of pair structures including GaInP/AlGaInP, GaP/AlGaP, InGaP/AlGaP, InGaN/GaN, InGaN/InGaN, GaN/AlGaN, InAlGaN/GaN, GaAs/AlGaAs, or InGaAs/AlGaAs, but the embodiments are not limited thereto. The well layer may be formed of a material having a bandgap lower than a bandgap of the barrier layer.

As shown in FIG. 2B, the quantum well 114W2 according to the second embodiment may have a composition of an $(Al_pGa_{1-p})_qIn_{1-q}P$ layer ($0.05 \leq p \leq 0.20$, $0.4 \leq q \leq 0.6$). The quantum well 114W2 may have a thickness T1 in the range of 150 Å to 170 Å. The quantum well 114W2 may be paired with the quantum barrier 114B, and twelve pairs may be formed, but embodiments are not limited thereto. The thickness T1 of the quantum well 114W2 in the active layer may be thicker, so that radioactive recombination may be increased in an active layer region, and light efficiency may be improved.

As shown in FIG. 2C, according to the third embodiment, the quantum barrier 114B may include the last quantum barrier closest to the second conductive type second semiconductor layer 116, and the last quantum barrier may include the first last quantum barrier 114B1 having the Al composition of the first concentration and the second last quantum barrier 114B2 having the Al composition of the second concentration higher than the first concentration. The Al composition in the last quantum barrier may be graded or stepped from the quantum well 114W2 toward the second conductive type second semiconductor layer 116. For example, the second last quantum barrier 114B2 may be provided closer to the second conductive type second semiconductor layer 116 than the first last quantum barrier 114B1.

The last quantum barrier according to the third embodiment may include the first last quantum barrier 114B1, which may be an $(Al_{p1}Ga_{1-p1})_{q1}In_{1-q1}P$ layer ($0.60 \leq p1 \leq 0.80$, $0.4 \leq q1 \leq 0.6$), and the second last quantum barrier 114B2 which is an $(Al_{p2}Ga_{1-p2})_{q2}In_{1-q2}P$ layer ($0.80 \leq p2 \leq 0.90$, $0.4 \leq q2 \leq 0.6$). The first last quantum barrier 114B1 and the second last quantum barrier 114B2 may have an equal thickness, but the embodiment is not limited thereto. The last quantum barrier may be formed in the Al composition step structure including the first last quantum barrier 114B1 having the Al composition of the first concentration and the second last quantum barrier 114B2 having the Al composition of the second concentration higher than the first concentration, thereby effectively blocking electrons and improving layer quality.

Next, the second conductive type second semiconductor layer 116 may be formed with a semiconductor compound, for example, a Group III-V or Group II-VI compound semiconductor and may be doped with the first conductive type dopants. For example, the second conductive type second semiconductor layer 116 may include a semiconductor material having a compositional formula of $In_xAl_yGa_{1-x-y}P$ ($0 \leq x \leq 1$, $0 \leq y \leq 1$, $0 \leq x+y \leq 1$) or $In_xAl_yGa_{1-x-y}N$ ($0 \leq x \leq 1$, $0 \leq y \leq 1$, $0 \leq x+y \leq 1$). When the second conductive type second semiconductor layer 116 is a P-type semiconductor layer, the P-type dopants may include Mg, Zn, Ca, Sr, or Ba.

The first conductive type first semiconductor layer 112 may be an N-type semiconductor layer, and the second conductive type second semiconductor layer 116 may be a P-type semiconductor layer, but the embodiment is not limited thereto. For example, the first conductive type first semiconductor layer 112 may be a P-type semiconductor layer, and the second conductive type second semiconductor layer 116 may be an N-type semiconductor layer. In addition, a semiconductor having a polarity opposite to a polarity of the second conductive type, for example, an N type semiconductor layer may be formed on the second conductive type second semiconductor layer 116. Accordingly, the light emitting structure 110 may be formed in one of an N-P junction structure, a P-N junction structure, an N-P-N junction structure, or a P-N-P junction structure.

As shown in FIG. 13, the second conductive type third semiconductor layer 123, the second conductive type fourth semiconductor layer 124, and the second conductive type fifth semiconductor layer 125 may be formed on the second conductive type second semiconductor layer 116. The second conductive type third semiconductor layer 123 and the second conductive type fourth semiconductor layer 124 may include AlGaInP-based semiconductor layers. The second conductive type fifth semiconductor layer 125 may include a P type GaP-based layer having the second concentration.

In the red light emitting device, the Al composition of the second conductive type fourth semiconductor layer 124 may be lower than the Al composition of the second conductive type third semiconductor layer 123. For example, the second conductive type third semiconductor layer 123 may have the composition of an $(Al_{x3}Ga_{1-x3})_yIn1-yP$ layer ($0.80 \leq x3 \leq 90$, $0.4 \leq y \leq 0.6$). The second conductive type fourth semiconductor layer 124 may have the composition of an $(Al_{x4}Ga_{1-x4})_yIn_{1-y}P$ layer ($0.50 \leq x4 \leq 70$, $0.4 \leq y \leq 0.6$).

The bandgap energy of the second conductive type fourth semiconductor layer 124 may be lower than the bandgap energy of the second conductive type third semiconductor layer 123. The bandgap energy of the second conductive type fourth semiconductor layer 124 may be higher than the bandgap energy of the second conductive type fifth semiconductor layer 125.

According to the embodiment, a GaP layer quality may be improved by optimizing the Al composition of the p-AlGaInP-based layer. The second conductive type fourth semiconductor layer 124 serving as an energy bandgap buffer layer may be provided between the second conductive type third semiconductor layer 123 and the second conductive type fifth semiconductor layer 125. The second conductive type fourth semiconductor layer 124 may be provided between the second conductive type third semiconductor layer 123 and the second conductive type fifth semiconductor layer 125 to reduce strain between the second conductive type third semiconductor layer 123 and the second conductive type fifth semiconductor layer 125 so that light emitting device quality may be improved.

As shown in Table 1 and FIG. 3, voltage may be improved in the first to third embodiments as compared to the comparative example (Ref) in the I-V curve. As shown in FIG. 4, in relation to 1 W chip package (PKG) thermal droop, the P—AlGaInP 60% (the first embodiment), the Wide Well (the second embodiment), and the 2 step L/B (the third embodiment) may be improved by about 1% to 2.5% based on the Ref (the comparative example). The EQE of the first to third embodiments may be improved by about 4% to about 8% based on the EQE of the comparative example. The fourth embodiment, obtained by combining the first to third embodiments with each other, may have an improved EQE as compared to the EQE of the comparative example.

As shown in FIG. 6, the second conductive type fifth semiconductor layer 125 may include the superlattice structure of a GaP layer 125a/$In_xGa_{1-x}P$ layer ($0 \leq x \leq 1$) 125b. The second conductive type fifth semiconductor layer 125 may include a third GaP layer 125c doped with second conductive type dopants. The second conductive type dopants may be P type conductive type dopants, but the embodiment is not limited thereto. The second conductive type fifth semiconductor layer 125 may be doped with the second conductive type dopants having the first concentration and the GaP layer 125a may be doped with the second conductive type dopants having the concentration lower than the first concentration. The $In_xGa_{1-x}P$ layer ($0 \leq x \leq 1$) 125b may not be doped with the second conductive type dopants.

For example, the second conductive type fifth semiconductor layer 125 may be doped with magnesium (Mg) atoms at a concentration of about $10 \times 10^{18}$ atoms/cm$^3$, the GaP layer 125a may be doped with Mg atoms at a concentration of about $10 \times 10^{17}$ atoms/cm$^3$, and the In$_x$Ga$_{1-x}$P layer ($0 \leq x \leq 1$) 125b may not be doped with the second conductive type dopants, but the embodiment is not limited thereto. Accordingly, the second conductive type fifth semiconductor layer 125 may have the superlattice structure of the GaP layer 125a/In$_x$Ga$_{1-x}$P layer ($0 \leq x \leq 1$) 125b. The In$_x$Ga$_{1-x}$P layer ($0 \leq x \leq 1$) 125b may represent a lower energy level, and the GaP layer 125a may represent an energy level higher than an energy level of the In$_x$Ga$_{1-x}$P layer ($0 \leq x \leq 1$) 125b.

Thereafter, a transmissive electrode layer 140 may be formed on the second conductive type fifth semiconductor layer 125. The transmissive electrode layer 140 may include an ohmic layer, and may be formed by multiply stacking single metal, a metallic alloy, or a metallic oxide to effectively inject holes. For example, the transmissive electrode layer 140 may be formed of a material having an excellent electrical contact with a semiconductor. For example, the transmissive electrode layer 140 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, or Hf, but the embodiment is not limited thereto.

Then, as shown in FIG. 14, a second electrode 152 may be formed on the transmissive electrode layer 140, and a first electrode 151 may be formed under the substrate 105. The second electrode 152 may be electrically connected with the transmissive electrode layer 140. The second electrode 152 may include a contact layer, an intermediate layer, and an upper layer. The contact layer may include a material selected from among Cr, V, W, Ti, and Zn for ohmic contact. The intermediate layer may include a material selected from among Ni, Cu, and Al. The upper layer may include, for example, Au. The first electrode 151 may include a conductive type metal layer. For example, the first electrode 151 may include at least one of Ti, Cr, Ni, Al, Pt, Au, W, Cu, Mo, Cu—W, or a semiconductor substrate implanted with impurities (e.g., Si, Ge, GaN, GaAs, ZnO, SiC, and SiGe).

Seventh Embodiment

Figure 15:
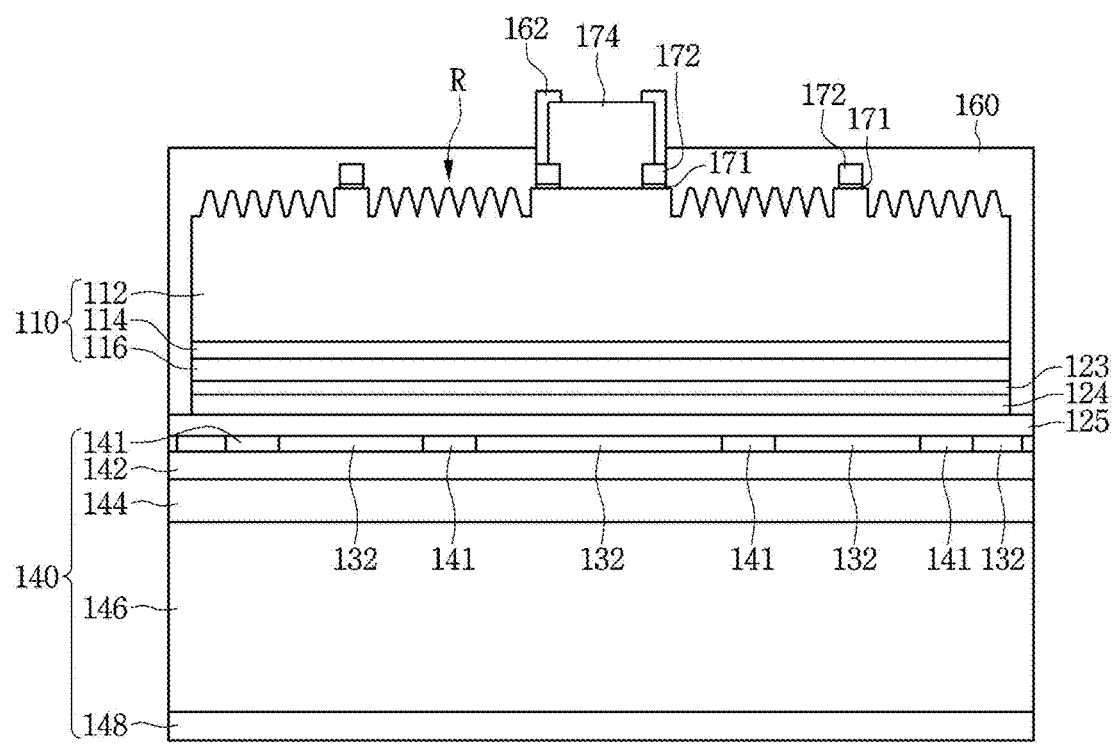
FIG. 15 is a sectional view of a light emitting device according to a seventh embodiment.

Referring to FIG. 15, a light emitting device according to a seventh embodiment may include the features of the previous embodiments, and the following description may focus on additional main features of the seventh embodiment. In the light emitting device according to the seventh embodiment, a second electrode layer 140 may be provided under a light emitting structure 110. The second electrode layer 140 may include at least one of a second ohmic layer 141, a metallic reflective layer 142, a bonding layer 144, a support substrate 146, and a lower electrode 148.

The second ohmic layer 141 may partially make contact with the second conductive type fifth semiconductor layer 125, and an omnidirectional reflective layer 132 may be provided in the second ohmic layer 141. For example, the second ohmic layer 141 may be formed of a material representing an excellent electrical contact with a semiconductor. For example, the second ohmic layer 141 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, or Hf, but the embodiment is not limited thereto.

The omnidirectional reflective layer 132 may have a structure including a metal-based reflective layer and a low refractive index layer (not shown) formed on the metal-based reflective layer. The metal-based reflective layer may include Ag or Al, and the low refractive index layer having an insulating property may include a transparent material including SiO2, Si3N4, or MgO, but the embodiment is not limited thereto. The metallic reflective layer 142 may be formed of a material having an excellent electrical contact, and a material having high reflectance. For example, the metallic reflective layer 142 may include metal including at least one of Pd, Ir, Ru, Mg, Zn, Pt, Ag, Ni, Al, Rh, Au, and Hf, or the alloy thereof. The bonding layer 144 may include nickel (Ni), titanium (Ti), gold (Au), or the alloy thereof, but the embodiment is not limited thereto.

A support member may selectively include, for example, a carrier wafer (e.g., GaN, Si, Ge, GaAs, ZnO, SiGe, or SiC), copper (Cu), gold (Au), a copper alloy (Cu alloy), nickel (Ni), or copper-tungsten (Cu—W). The lower electrode 148 may include at least one of Ti, Cr, Ni, Al, Pt, Au, W, Cu, Mo, or Cu—W. A predetermined light extraction pattern R may be formed on the light emitting structure 110. For example, a roughness pattern R may be formed on a top surface of the first conductive type first semiconductor layer 112 through a dry etching process or a wet etching process to form the light extraction pattern R so that light extraction efficiency may be improved.

A pad electrode 174 may be formed on the first conductive type first semiconductor layer 112. A branch electrode 172 may be formed on the first conductive type first semiconductor layer 112. A third ohmic layer 171 may be provided between the first conductive type first semiconductor layer 112 and the branch electrode 172, and the pad electrode 174 may be formed on the branch electrode 172.

The pad electrode 174 may make contact with both of the first conductive type first semiconductor layer 112 and the branch electrode 172. The contact part between the pad electrode 174 and the first conductive type first semiconductor layer 112 may not be in ohmic contact due to schottky contact so that a low current injection and current spreading may occur, thereby improving optical power.

The third ohmic layer 171 may be formed of a material having an excellent electrical contact with a semiconductor. For example, the third ohmic layer 171 may include at least one of Ag, Ni, Cr, Ti, Al, Rh, Pd, Ir, Ru, Mg, Zn, Pt, Au, Hf, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO, but the embodiment is not limited thereto. The pad electrode 174 and the branch electrode 172 may include at least one of Ti, Cr, Ni, Al, Pt, Au, W, Cu, Mo, or Cu—W, but the embodiment is not limited thereto.

A first passivation layer 160 may be formed on a top surface and a lateral side of the light emitting structure 110, and a second passivation layer 162 may be formed on a portion of a lateral side and a top surface of the pad electrode 174. The first passivation layer 160 and the second passivation layer 162 may be formed of an insulating material such as an oxide or a nitride, but the embodiment is not limited thereto. A plurality of red light emitting devices according to the embodiment may be arrayed in the form of a package on a substrate, and a light guide plate, a prism sheet, a diffusion sheet and a phosphor sheet, which may be optical members, may be provided on the path of light emitted from a light emitting device package.

Figure 16:
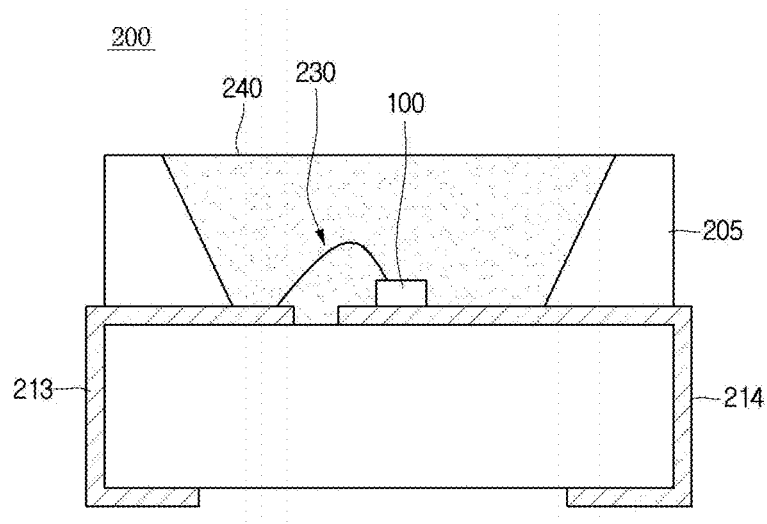
FIG. 16 is a sectional view showing a light emitting device package according to an embodiment.

FIG. 16 is a sectional view of a light emitting device package 200 in which a red light emitting device according to the embodiments may be mounted. The light emitting device package 200 according to the embodiment may include a package body 205, third and fourth electrode layers 213 and 214 mounted on the package body 205, a red light emitting device 100 mounted in the package body 205 and electrically connected with the third and fourth electrodes 213 and 214, and a molding member 240 including a phosphor 232 to surround the red light emitting device 100.

The third electrode layer 213 may be electrically insulated from the fourth electrode layer 214 and may supply power to the red light emitting device 100 by a wire 230. In addition, the third and fourth electrode layers 213 and 214 may reflect light emitted from the red light emitting device 100 to increase light efficiency and discharge heat emitted from the red light emitting device 100 to an outside. The red light emitting device 100 may be electrically connected with the third electrode layer 213 and/or the fourth electrode layer 214 through one of a wire scheme, a flip-chip scheme, and a die-bonding scheme. The red light emitting device 100 may be applied to a backlight unit, a lighting unit, a display device, an indicator, a lamp, a street lamp, a lighting device for a vehicle, a display device for a vehicle, or a smart watch, but the embodiment is not limited thereto.

Figure 17:
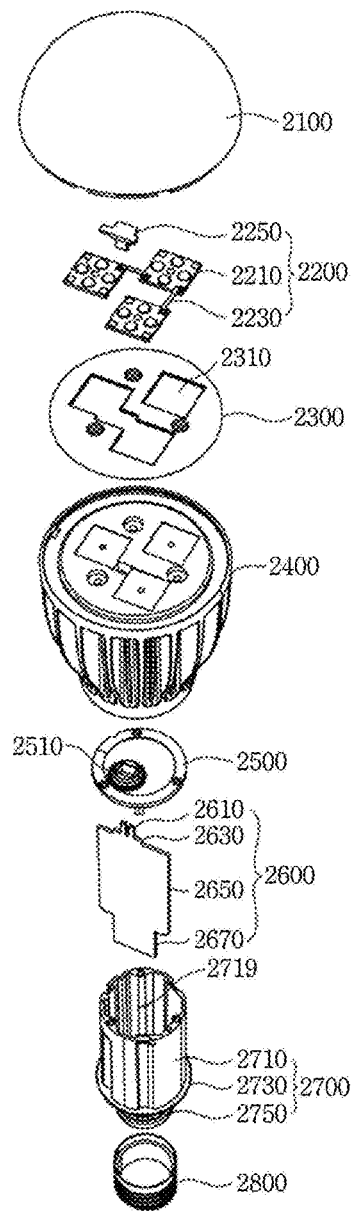
FIG. 17 is an exploded view of a lighting system according to the embodiment.

FIG. 17 is an exploded perspective view showing a lighting system according to an embodiment. The lighting system may include a cover 2100, a light source module 2200, a heat radiator 2400, a power supply 2600, an inner case 2700, and a socket 2800. The lighting system according to the embodiment may further include at least one of a member 2300 and a holder 2500. The light source module 2200 may include the red light emitting device 100 or the light emitting device package 200 according to the embodiment. The light source module 2200 may include a light source unit 2210, a connection plate 2230, and a connector 2250. The member 2300 may be provided on the top surface of the heat radiator 2400 and may have guide grooves 2310 into which a plurality of light source units 2210 and a connector 2250 may be inserted.

The holder 2500 may close a receiving groove 2719 of an insulating unit 2710 of an inner case 2700. Accordingly, the power supply 2600 received in the insulating unit 2710 of the inner case 2700 may be sealed. The holder 2500 may have a guide protrusion 2510. The power supply 2600 may include a protrusion part 2610, a guide part 2630, a base 2650, and an extension part 2670. The inner case 2700 may be provided therein with a molding part together with the power supply 2600. The molding part may be formed by solidifying a molding liquid to fix the power supply 2600 into the inner case 2700.

Embodiments disclosed herein provide a red light emitting device capable of representing higher optical power, a method of fabricating the light emitting device, a light emitting device package, and a lighting system. Embodiments disclosed herein also provide a red light emitting device capable of representing high electrical reliability, a method of fabricating the light emitting device, a light emitting device package, and a lighting system. Embodiments disclosed herein also provide a red light emitting device capable of overcoming droop to represent improved luminous intensity, a method of fabricating the light emitting device, a light emitting device package, and a light system.

According to embodiments disclosed herein, a red light emitting device may include a first conductive type first semiconductor layer, an active layer provided on the first conductive type first semiconductor layer and including a quantum well and a quantum barrier, a second conductive type second semiconductor layer on the active layer, a second conductive type third semiconductor layer on the second conductive type second semiconductor layer, a second conductive type fourth semiconductor layer on the second conductive type third semiconductor layer, and a second conductive type fifth semiconductor layer on the second conductive type fourth semiconductor layer. The second conductive type third semiconductor layer and the second conductive type fourth semiconductor layer may include an AlGaInP-based semiconductor layer, and an Al composition of the second conductive type fourth semiconductor layer may be lower than an Al composition of the second conductive type third semiconductor layer.

According to embodiments disclosed herein, a red light emitting device may include a first conductive type first semiconductor layer, an active layer on the first conductive type first semiconductor layer, a second conductive type second semiconductor layer on the active layer, a second conductive type third semiconductor layer on the second conductive type second semiconductor layer, and a second conductive type fifth semiconductor layer on the second conductive type third semiconductor layer. The second conductive type third semiconductor layer may include an $Al_xGa_{1-x}InP$ layer ($0 \leq x \leq 1$), and an Al composition may be graded in the second conductive type third semiconductor layer.

According to embodiments disclosed herein, a red light emitting device may include a first conductive type first semiconductor layer, an active layer on the first conductive type first semiconductor layer, a second conductive type second semiconductor layer on the active layer, a second conductive type fourth semiconductor layer on the second conductive type second semiconductor layer, and a second conductive type fifth semiconductor layer on the second conductive type fourth semiconductor layer. A doping concentration of second conductive type atoms of the second conductive type fourth semiconductor layer may be lower than a doping concentration of second conductive type atoms of the second conductive type fifth semiconductor layer. According to the embodiment, a lighting system may include a light emitting unit including the red light emitting device.

It will be understood that when a layer (or film) is referred to as being 'on' another layer or substrate, it may be directly on another layer or substrate, or intervening layers may also be present. Further, it will be understood that when a layer is referred to as being 'under' another layer, it may be directly under another layer, and one or more intervening layers may also be present. In addition, it will also be understood that when a layer is referred to as being 'between' two layers, it may be the only layer between the two layers, or one or more intervening layers may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A red light emitting device comprising:
a first semiconductor layer having a first conductivity;
an active layer provided on the first semiconductor layer including a quantum well and a quantum barrier;
a second semiconductor layer having a second conductivity provided on the active layer;
a third semiconductor layer having the second conductivity and provided on the second semiconductor layer; and
a fifth semiconductor layer having the second conductivity and provided on the third semiconductor layer,
wherein the third semiconductor layer includes an AlGaInP-based semiconductor layer, and
an Al composition of the fifth semiconductor layer is lower than an Al composition of the third semiconductor layer,
wherein the quantum barrier includes a last quantum barrier closest to the second semiconductor layer, the last quantum barrier including:
a first quantum barrier having a first Al concentration; and
a second quantum barrier having a second Al concentration higher than the first Al concentration, the second quantum barrier being provided closer to the second semiconductor layer than the first quantum barrier,
wherein the second Al concentration of the second quantum barrier is higher than the first Al concentration of the first quantum barrier throughout an entirety of the second quantum barrier layer,
wherein the first quantum barrier and the second quantum barrier have equal thickness,
wherein the fifth semiconductor layer includes a superlattice structure of a GaP layer/$In_xGa_{1-x}P$ layer ($0 \leq x \leq 1$),
wherein the superlattice structure of the fifth semiconductor layer includes outer GaP layers including a first outer GaP layer provided on the third semiconductor layer and a second outer GaP layer provided opposite the first outer GaP layer,
wherein the fifth semiconductor layer is doped with a second conductive type dopant having a first dopant concentration, and the GaP layer is doped with the second conductive type dopant having a second dopant concentration lower than the first dopant concentration,
wherein the $In_xGa_{1-x}P$ layer ($0 \leq x \leq 1$) is not doped with the second conductive type dopant,
wherein the first and second outer GaP layers are doped with the second conductive type dopant having the first dopant concentration higher than the second dopant concentration,
wherein the GaP layer represents an energy level higher than that of the $In_xGa_{1-x}P$ layer ($0 \leq x \leq 1$), and
wherein the first and second outer GaP layers represent an energy level higher than that of the GaP layer.

2. The red light emitting device of claim 1, wherein the Al composition of the third semiconductor layer includes an $(Al_{x3}Ga_{1-x3})_yIn_{1-y}P$ layer ($0.80 \leq x3 \leq 90$, $0.4 \leq y \leq 0.6$).

3. The red light emitting device of claim 1, wherein the quantum well includes an $(Al_pGa_{1-p})_qIn_{1-q}P$ layer ($0.05 \leq p \leq 0.20$, $0.4 \leq q \leq 0.6$).

4. The red light emitting device of claim 3, wherein the quantum well has a thickness in a range of 150 Å to 170 Å.

5. The red light emitting device of claim 1, wherein the first Al concentration or the second Al concentration is graded toward the second semiconductor layer in the last quantum barrier.

6. A lighting system comprising a light emitting module including the red light emitting device of claim 1.

7. The red light emitting device of claim 1, a total Al concentration of the fifth semiconductor layer is lower than a total Al concentration of the third semiconductor layer.

8. A red light emitting device comprising:
a first semiconductor layer having first conductivity type dopants;
an active layer including a quantum well and a quantum barrier on the first semiconductor layer;
a second semiconductor layer having second conductivity type dopants on the active layer;
a third semiconductor layer having the second conductivity type dopants on the second semiconductor layer; and
a fourth semiconductor layer having the second conductivity type dopants on the third semiconductor layer,
wherein the third semiconductor layer includes an $Al_xGa_{1-x}InP$ layer ($0 \leq x \leq 1$), and an Al concentration that is graded,
wherein the quantum barrier includes a last quantum barrier closest to the second semiconductor layer, the last quantum barrier including:
a first quantum barrier having a first Al concentration; and
a second quantum barrier having a second Al concentration higher than the first Al concentration, the second quantum barrier being provided closer to the second semiconductor layer than the first quantum barrier,
wherein the second Al concentration of the second quantum barrier is higher than the first Al concentration of the first quantum barrier throughout an entirety of the second quantum barrier layer,
wherein the first quantum barrier and the second quantum barrier have equal thickness,
wherein the fourth semiconductor layer includes a superlattice structure having at least one GaP layer/$In_xGa_{1-x}P$ layer ($0 \leq x \leq 1$) pair,
wherein the superlattice structure of the fourth semiconductor layer includes a plurality of outer GaP layers, wherein a first outer GaP layer is provided on the third semiconductor layer, the at least one GaP layer/$In_xGa_{1-x}P$ layer ($0 \leq x \leq 1$) pair are provided on the first outer GaP layer, and a second outer GaP layer is provided on the at least one GaP layer/In$_x$Ga$_{1-x}$P layer (0≤x≤1) pair, wherein the fourth semiconductor layer is doped with a second conductive type dopant having a first dopant concentration, and the GaP layer is doped with the second conductive type dopant having a second dopant concentration lower than the first dopant concentration, wherein the In$_x$Ga$_{1-x}$P layer (0≤x≤1) is not doped with the second conductive type dopant, wherein the first and second outer GaP layers are doped with the second conductive type dopant having the first dopant concentration higher than the second dopant concentration, wherein the GaP layer represents an energy level higher than that of the In$_x$Ga$_{1-x}$P layer (0≤x≤1), and wherein the first and second outer GaP layers represent an energy level higher than that of the GaP layer.

9. The red light emitting device of claim 8, wherein the fourth semiconductor layer is thicker than the second semiconductor layer.

* * * * *